(12) United States Patent
Papanide et al.

(10) Patent No.: US 7,540,779 B2
(45) Date of Patent: Jun. 2, 2009

(54) RF SHIELDED, SERIES INDUCTOR, HIGH RF POWER IMPEDANCE MATCHING INTERCONNECTOR FOR $CO_2$ SLAB LASER

(75) Inventors: Adrian Papanide, Sheldon, CT (US); Frederick W. Hauer, Windsor, CT (US); Leon A. Newman, Glastonbury, CT (US); Thomas V. Hennessey, Jr., Lebanon, CT (US); Christian J. Shackleton, Granby, CT (US); Joel Fontanella, Tolland, CT (US); Gongxue Hua, Unionville, CT (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 12/051,232

(22) Filed: Mar. 19, 2008

(65) Prior Publication Data

US 2009/0004918 A1 Jan. 1, 2009

Related U.S. Application Data

(60) Provisional application No. 61/025,617, filed on Feb. 1, 2008, provisional application No. 60/919,806, filed on Mar. 23, 2007.

(51) Int. Cl.
*H01R 13/66* (2006.01)
(52) U.S. Cl. .................................. 439/620.03
(58) Field of Classification Search ............. 439/579, 439/620.3; 372/76, 38, 61; 307/106; 333/32
See application file for complete search history.

(56) References Cited

U.S. PATENT DOCUMENTS 4,352,188 A * 9/1982 Griffith .......................... 372/82

(Continued)

FOREIGN PATENT DOCUMENTS

DE     20 2004 010226 U1     12/2005

(Continued)

*Primary Examiner*—Jean F Duverne
(74) *Attorney, Agent, or Firm*—Morrison & Foerster LLP

(57) ABSTRACT

A RF shielded, series inductor, high power impedance matching network interconnector is provided for connecting an RF power supply to electrodes contained in the shielded, hermetically sealed laser tube housing of a slab laser system. The impedance matching interconnector comprises a short length of co-axial conductor and an impedance matching network that includes two L shaped networks. The inner conductor of the co-axial conductor is connected between the power supply output and the impedance matching network. The outer conductor of the co-axial conductor is grounded. The co-axial conductor has an impedance characteristic to match the power supply output impedance. The first L-shaped network includes a first inductor having a first end connected to the inner conductor of the co-axial conductor and a first capacitor connected to the second end of the first inductor and a second plate connected to ground. The second L shaped network includes a second inductor having a first end connected to the common connection between the second end of the first inductor and the first plate of the first capacitor and a second capacitor having a first plate connected to the second end of the second inductor and a second plate connected to ground. The common connection between the second end of the second inductor and the first plate of the second capacitor is connected through the shielded, hermetically sealed laser tube housing to the electrodes of the slab laser system. The two L-shaped networks may be implemented in a "single capacitor" configuration for lower power applications or in a "multi-capacitor" configuration for higher power applications.

14 Claims, 9 Drawing Sheets

U.S. PATENT DOCUMENTS

| | | | | |
|---|---|---|---|---|
| 4,761,786 A | * | 8/1988 | Baer | 372/10 |
| 4,975,920 A | | 12/1990 | Egawa | 372/38 |
| 5,157,272 A | | 10/1992 | Seddon | 307/106 |
| 5,185,687 A | * | 2/1993 | Beihoff et al. | 361/45 |
| 5,377,218 A | | 12/1994 | Guenther | 372/61 |
| 5,949,806 A | | 9/1999 | Ness et al. | 372/38 |
| 2005/0069011 A1 | | 3/2005 | Hill | 372/76 |
| 2007/0178760 A1 | * | 8/2007 | Motohashi et al. | 439/579 |

FOREIGN PATENT DOCUMENTS

| | | |
|---|---|---|
| EP | 0 592 014 A1 | 10/1987 |
| GB | 780843 | 8/1957 |

* cited by examiner

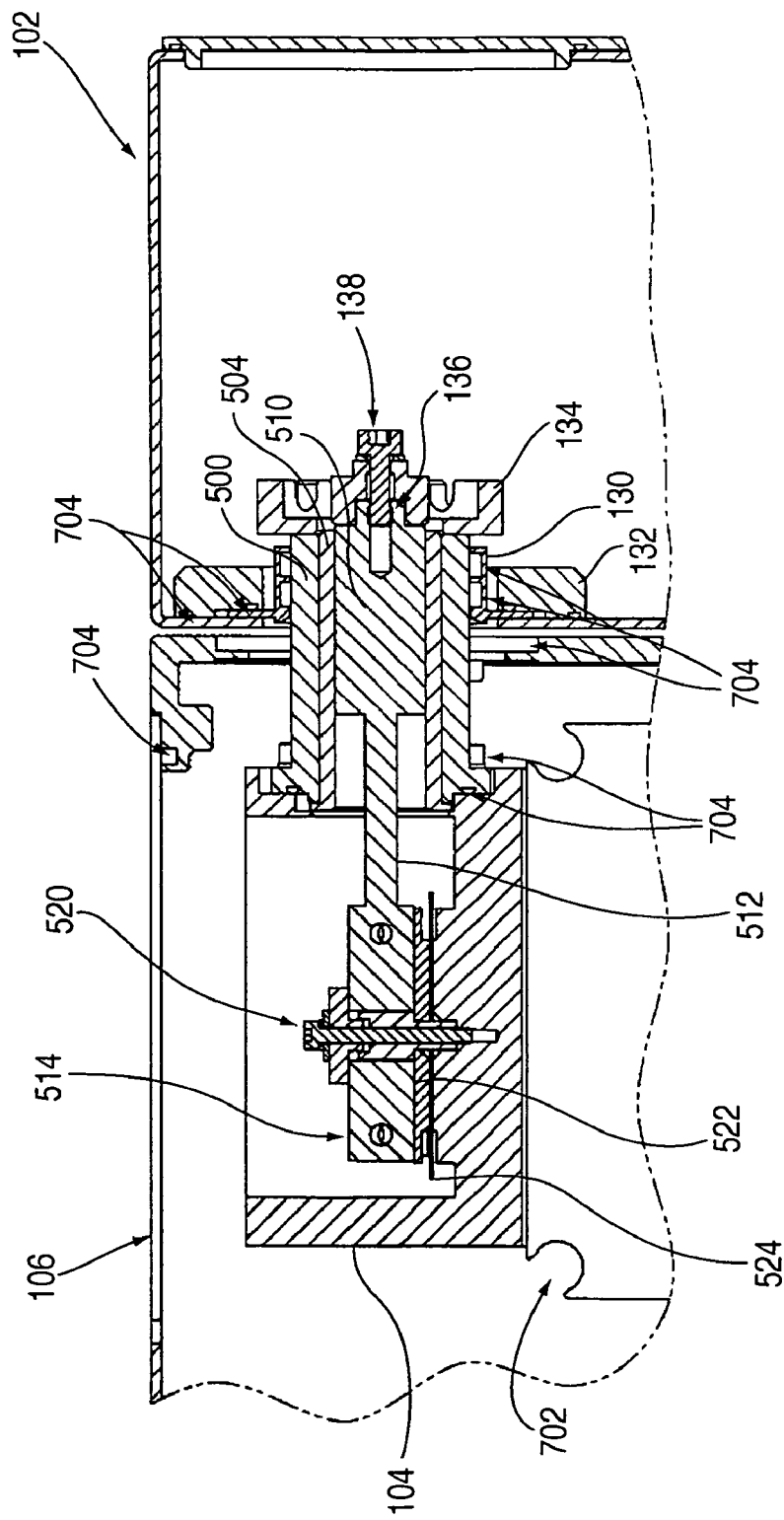

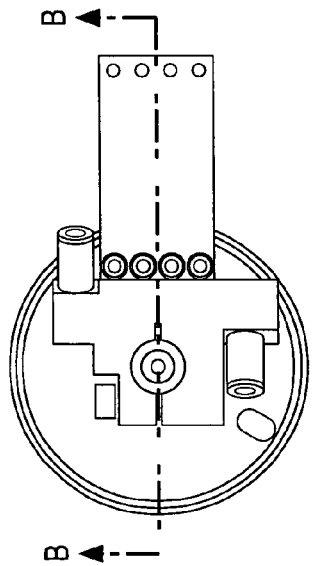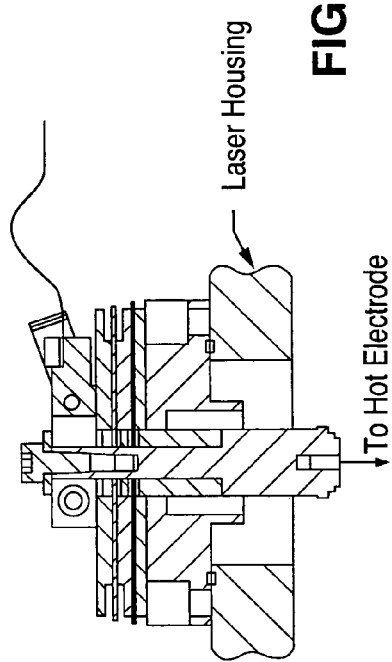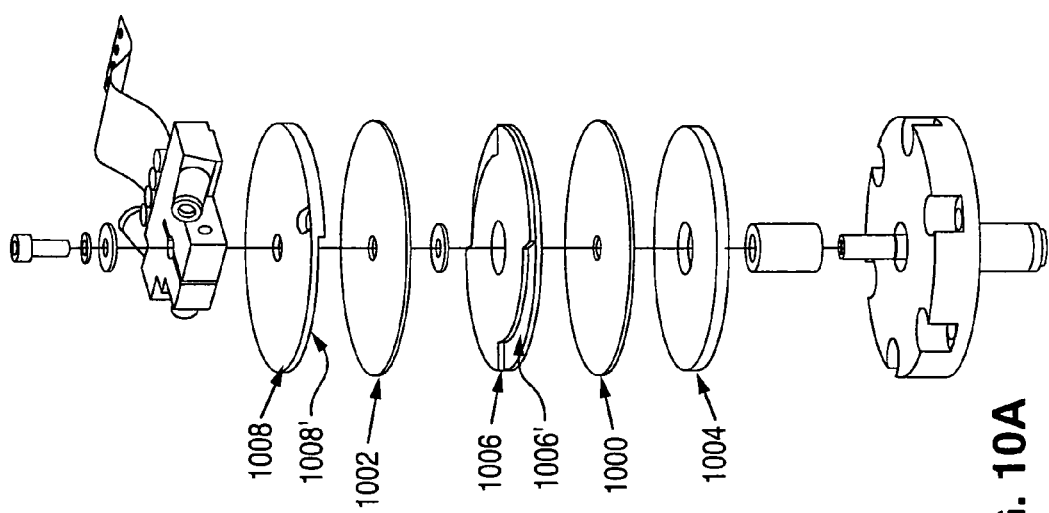

RF SHIELDED, SERIES INDUCTOR, HIGH RF POWER IMPEDANCE MATCHING INTERCONNECTOR FOR $CO_2$ SLAB LASER

PRIORITY CLAIM

This application claims priority from U.S. Provisional Application No. 60/919,806, filed Mar. 23, 2007, and titled "RF Shielded, Series Inductor, High RF Power, Impedance Matching Interconnector for Slab $CO_2$ Laser." Provisional Application No. 60/919,806 is hereby incorporated by reference herein in its entirety.

This application also claims priority from U.S. Provisional Application No. 61/025,617, filed Feb. 1, 2008, and titled "High Voltage Hermetic Sealed RF Feed-through for Super Pulsed $CO_2$ Slab Lasers." Provisional Application No. 61/025,617 is hereby incorporated by reference herein in its entirety.

FIELD OF THE INVENTION

The present invention relates generally to carbon dioxide ($CO_2$) slab lasers and, in particular, to RF-shielded, series, inductor, high RF power impedance matching network interconnectors for use in $CO_2$ slab laser systems.

BACKGROUND OF THE INVENTION

FIG. 1 shows a basic packaging concept for a high power $CO_2$ slab laser system 100. The laser system 100 includes three basic system sub-assemblies: a solid-state high power RF supply box 102, a RF impedance matching network box 104 that contains the components required to match the output impedance of the RF power supply 102 to the input impedance of the laser discharge, and a hermetically sealed $CO_2$ laser tube housing box 106 that contains the laser tube housing that contains the laser's gas mixture, electrodes and the optical resonator. To prevent stray RF radiation from leaking into the atmosphere and causing electromagnetic (EM) interferences, all three sub-assembly boxes 102, 104 and 106 are enclosed in grounded metal enclosures and their input and output ports are all heavily shielded. To prevent overheating, all three sub-assemblies 102, 104 and 106 are also provided with liquid cooling.

As shown in FIG. 1, DC power 108, typically at 48 volts, is provided to the RF supply box 102. An input command signal port 110 is also provided to enable a system operator to provide turn-on/turn-off pulsing instructions to the RF power supply box 102. The power supply box 102 may also contain diagnostic circuitry (not shown in FIG. 1) to report the status 112 of the system 100 to an operator.

From a laser efficiency and cost viewpoint, it is desirable to locate all three sub-assemblies 102, 104 and 106 as close together as possible to eliminate RF losses and costs associated with long co-axial cables.

Co-pending and commonly assigned U.S. application Ser. No. 11/711,192, filed on Apr. 27, 2007, by Howard Knickerbocker and Frederick Hauer, and titled "Power Combiner", discloses subject matter contained in the RF power supply box 102 shown in FIG. 1 hereof. application Ser. No. 11/711,192 is hereby incorporated by reference herein in its entirety to provide background information regarding the present invention.

Co-pending and commonly assigned U.S. application Ser. No. 12/069,939, filed on Feb. 14, 2008, by Shackleton, Hennessey, Seguin and Hauer, and titled "High Power Low Inductance RF Hermetic Sealed Feed-Through for Slab $CO_2$ Lasers", discloses subject matter associated with the low inductance hermetic sealed feed-through contained in the network matching box 104 of FIG. 1 for making RF contact to the center of the lengths of the two discharge electrodes within the laser tube housing box 106. application Ser. No. 12/069,939 is hereby incorporated by reference herein in its entirety to provide background information regarding the present invention.

U.S. Provisional Application No. 60/902,974, filed on Feb. 23, 2007, by Shackleton, Newman, Kiehne and Hua, and titled "Confined RF Discharge in $CO_2$ Laser with Hybrid Slab/Wave-Guide Unstable Resonators" discloses subject matter contained within the electrode assembly of the laser tube housing 106 of FIG. 1 which improves laser output beam pointing stability.

SUMMARY OF THE INVENTION

The present invention provides a RF shielded, series inductor, high RF power impedance matching network interconnector that connects an RF power supply to laser tube housing of a high power $CO_2$ slab laser. The impedance matching interconnector comprises a short length of co-axial conductor having an inner conductor connected to receive the power output of the RF power supply and a grounded outer conductor. The co-axial conductor has a characteristic of impedance to match the power supply output impedance. An impedance matching network that includes two L shaped networks couples the co-axial conductor to laser electrodes contained in the hermetically sealed laser tube housing. The first L shaped network includes a first inductor having a first end connected to the inner conductor of the co-axial conductor and a first capacitor having a first plate connected to a second end of the first inductor and a second plate connected to ground. The second L shaped network includes a second inductor having a first end connected to the common connection between the second end of the first inductor and the first plate of the first capacitor and a second capacitor having a first plate connected to a second end of the second inductor and a second plate connected to ground. The common connection between the second end of the second inductor and the first plate of the second capacitor is connected through the shielded, hermetically sealed laser tube housing to the electrodes of the slab laser system.

The two L shaped networks may be implemented in a "single capacitor" configuration for lower power applications, or in a "multi-capacitor" configuration for higher power applications.

The features and advantages of the various aspects of the present invention will be more fully understood and appreciated upon consideration of the following detailed description of the invention and the accompanying drawings, which set forth illustrative embodiments in which the concepts of the invention are utilized.

DESCRIPTION OF THE DRAWINGS

FIG. 7 is a partial cross section drawing, taken through section A-A in FIG. 4, illustrating a shield assembly utilizable in the FIG. 1 laser system.

FIGS. 10A, 10B and 10C are exploded, top and partial-cross section views, respectively, illustrating details of the twin capacitor configuration shown in FIG. 9B.

DETAILED DESCRIPTION OF THE INVENTION

Figure 1:
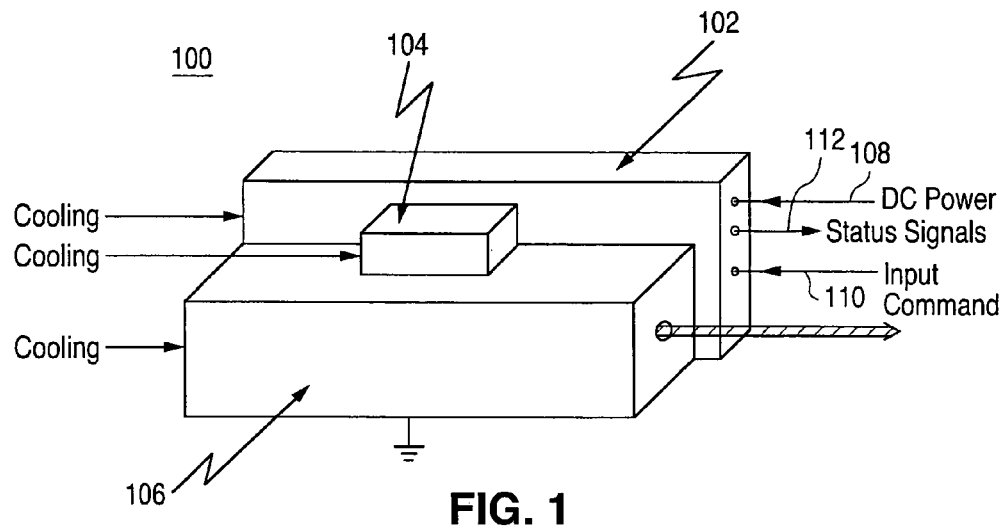
FIG. 1 is a perspective drawing illustrating a basic packaging concept for a high power $CO_2$ slab laser system.
Figure 2:
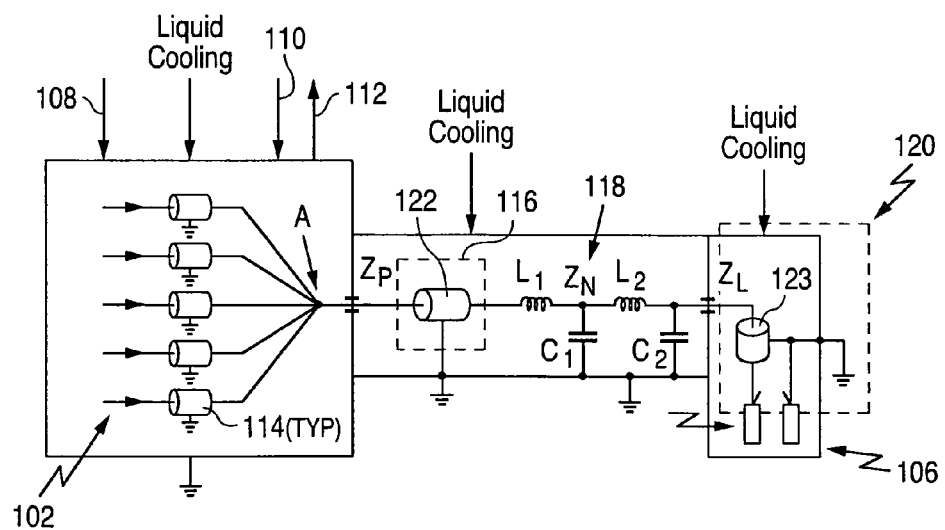
FIG. 2 is a schematic drawing illustrating an embodiment of the electrical connections necessary to interconnect the three major slab laser sub-assemblies shown in FIG. 1

FIG. 2 shows details, in schematic form, of an embodiment of the electrical connections required to connect together the three major sub-assemblies 102, 104 and 106 of the slab laser system 100 shown in FIG. 1. The solid-state, high power RF power supply box 102 is of the power combiner design described in detail in above-cited application Ser. No. 11/711, 192. Shown in FIG. 2, as an example, are five electrical co axial cable leads 114 from five power amplifiers (not shown), each of which is connected to one of the 50 Ohm transmission line co-axial cables 114. The outputs of the five co-axial cables 114 are brought to a common point A that is contained within the grounded RF power supply box 102. At the point A, where the five co-axial cables 114 come together, the impedance $Z_P$=10 Ohms. To prevent stray EM radiation from being emitted into the atmosphere, a well shielded RF interconnect box 116 is required to bring the combined power from the five co-axial cables 114 through the metal RF grounded side walls of the RF power supply box 102 to the impedance network matching box 104, and then to an impedance matching network 118 which in turn connects to a hermetically sealed low impedance feed-through box 120 to match the slab laser's discharge impedance within the hermetically sealed laser tube housing box 106. The mechanical and electrical details of how this EM shielding is accomplished, which are described in detail below, are an aspect of the present invention.

Those skilled in the art will appreciate that there are many approaches to achieving the desired impedance matching network contained within the impedance matching network box 104. For example, the final design may be achieved by using circuit design simulation analysis to guide the physical measurements and alternately matching the simulation results to the measurements to obtain the lowest RF standing wave ratio reflected from the discharge under operating conditions.

The design approach selected for the impedance matching network disclosed herein comprises essentially two L shaped networks, as shown in box 104 in FIG. 2. One L shaped network includes inductor $L_1$ and capacitor $C_1$; the other L shaped network includes inductor $L_2$ and capacitor $C_2$. The design of the shielded, high power impedance matching interconnector box 116 and the two L shaped L/C networks, both contained within the liquid cooled, RF shielded, impedance matching network box 104, is also an aspect of the present invention.

As shown in FIG. 2, a short co-axial cable 122 having a characteristic impedance of 10 Ohms is utilized to preserve the $Z_P$=10 Ohm output impedance of the power combined RF power supply 102 and to obtain the required RF shielding in transitioning the RF connection through the grounded side walls of both the power supply box 102 and the impedance matching network box 104. As discussed in greater detail below, the diameter of the center conductor of this co-axial interconnector 122 that extends past the insulator of the short co-axial line is reduced in diameter to provide the desired value for the $L_1$ inductor. The $L_1$ inductor and $C_1$ capacitor combination increases the impedance at the point where inductor $L_1$ and capacitor $C_1$ are connected to a value $Z_H$ as shown in FIG. 2. This $Z_H$ impedance is reduced to the $Z_L$ impedance of the discharge by the second L shaped network that includes inductor $L_2$ and capacitor $C_2$. The RF shielded connection that passes through one of the grounded side walls of the impedance matching network box 104 and into the hermetically sealed laser tube housing 106 is provided by a hermetically sealed low inductance RF feed-through 120 shown in FIG. 2 and described in detail in above-cited application Ser. No. 12/069,939.

An increase in impedance from $Z_P$ to $Z_H$ was found necessary in order to realize practical values for the inductor $L_2$, capacitor $C_1$ and especially for capacitor $C_2$, that can fit within the impedance matching network box 104 in order to match the low impedance of the laser discharge impedance $Z_L$ of approximately 3.6-j 1.4 Ohms for the 400W average power laser having electrodes approximately 53.2 cm long, 10 cm wide and a gap of 0.053 inches high. The impedance step up from $Z_P$ to $Z_H$ is obtained by increasing the value of inductor $L_1$, thereby requiring an increase in inductor $L_2$ and a decrease in capacitor $C_2$. An increase in inductor $L_1$ is obtained by decreasing the diameter (i.e., to 0.25 inches) and increasing the length (i.e., to 1.5 inches) of the center conductor extending past the short co-axial cable structure 122 of box 116 in FIG. 2.

Figure 3:
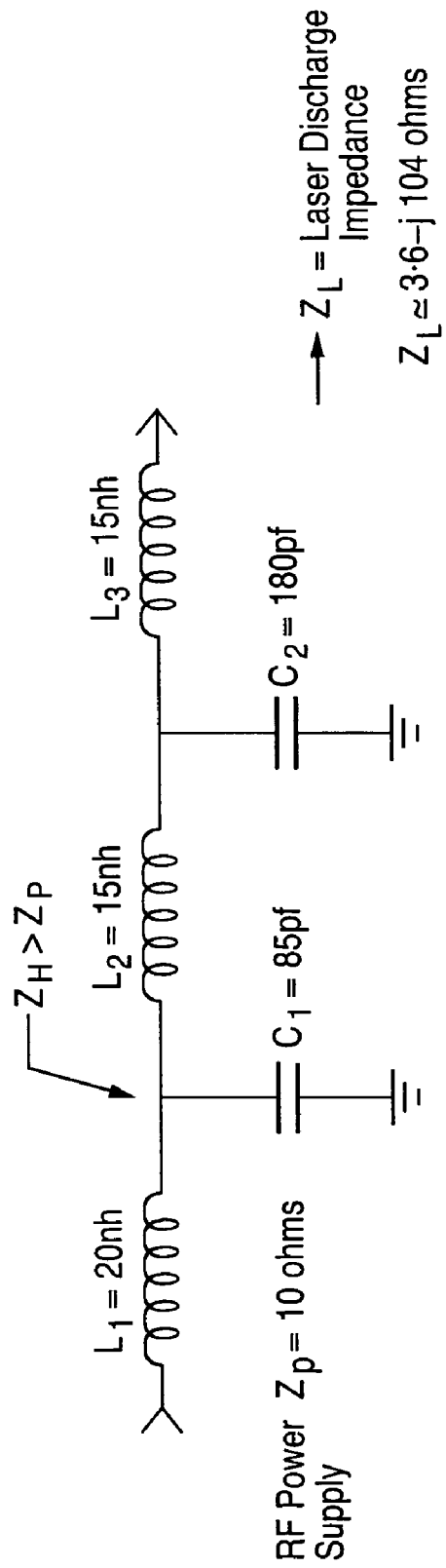
FIG. 3 is a schematic drawing that summarizes the values of the components of the impedance matching network shown in FIG. 2.

The values of the two L shaped L-C networks plus the input inductance ($L_3$) of the co-axial cable 123 of feed-through 120 in FIG. 2 that were found to match the low discharge impedance of the laser (i.e., $Z_L$) that fit within the box 104 of FIG. 2 are summarized in FIG. 3. In FIG. 3, $L_1$ is the inductance from the output conductor of the co-axial cable 122 of box 116 of FIG. 2 and $L_2$ is the inductance for the input conductor of the co-axial cable 123 of box 120 of FIG. 2. Inductor $L_3$ of FIG. 3 is the lead inductance going into the outer conductor of the co-axial cable 123 of box 120 of FIG. 2. The impedance matching approach leading to the values shown in FIG. 3, as well as the mechanical implementations of the RF shielded series inductor high power interconnector and the two L shaped L-C impedance matching networks to match the higher output impedance of a RF power combiner power supply to a lower impedance of a high power (i.e., greater than several hundred watts of average output power) slab laser, are additional features of the present invention.

Figure 4:
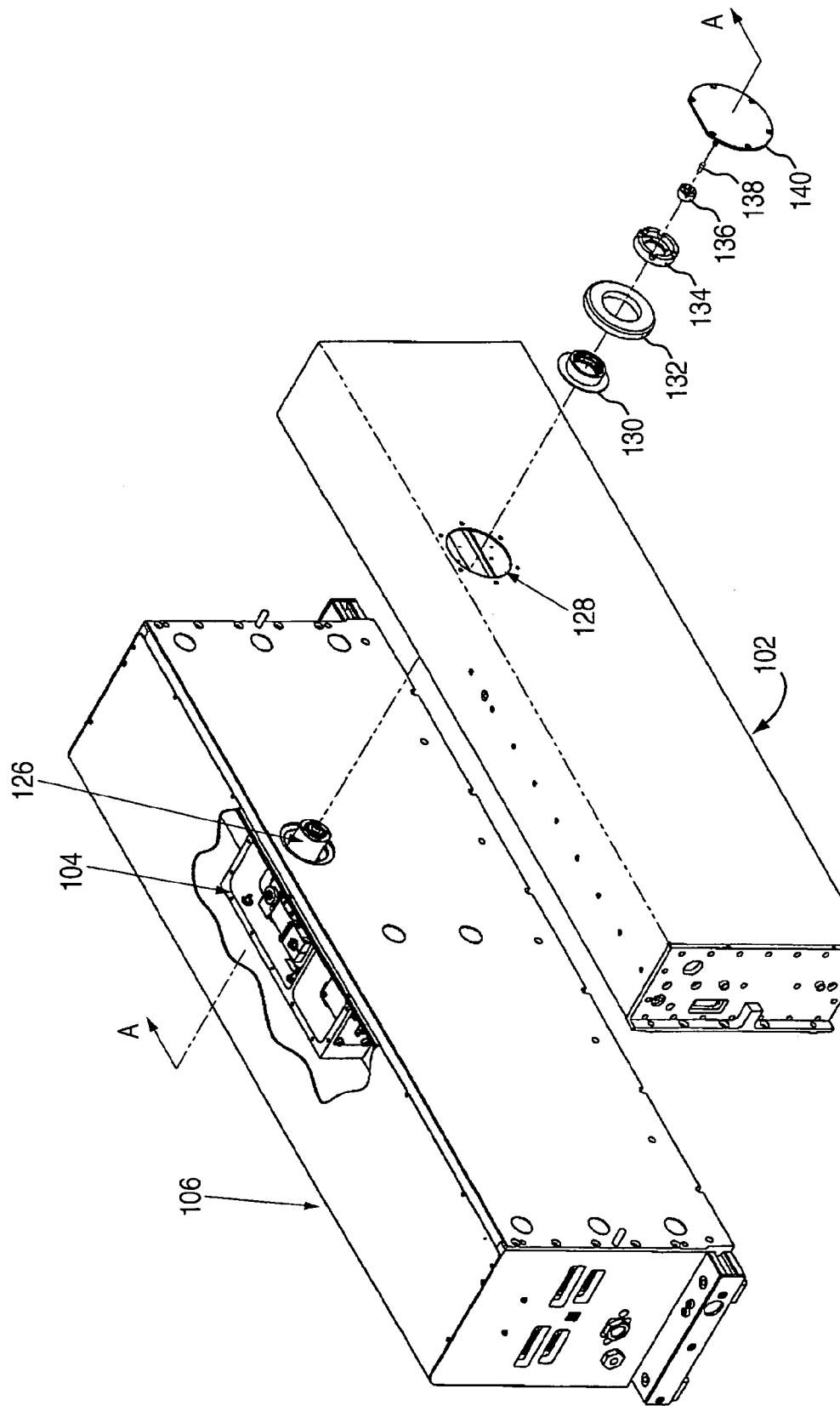
FIG. 4 is a perspective drawing illustrating an exploded view of an embodiment of the laser system shown in FIG. 1.

FIG. 4 provides a detailed exploded illustration of an embodiment of the assembly of an RF grounded cabinet 106 that contains a laser tube housing and an impedance matching network box 104. The cut-away of the laser housing cabinet 106 shows the position of the impedance matching network box 104 and the protrusion of the RF interconnect housing assembly 126 into the RF grounded cabinet 106 that contains the RF power combiner power supply 102. The opening 128 in the opposite wall of the power supply cabinet 102 is also shown in FIG. 4 through which a shield floating ring 130, a shield outer ring 132 and a ground ring 134 of the power combiner are inserted. The ground outer conductors of the five co-axial cables 114 shown in FIG. 2 within the solid state high power RF power supply box 102 are connected to the ground ring 134. The five inner conductors of the five co-axial cables 114 shown in FIG. 2 in the solid state high power RF power supply box 102 are connected to item 136 in FIG. 4. Item 136 in FIG. 4 represents the power combiner connection point A discussed above. An insulator tube (item 504 in FIG. 5) fits over the power combiner connection point, insulating it from the ground ring 134. Screw 138 holds the center conductor of the power combiner connection point to the RF interconnector housing 126. The access cover 140 is required to cover-up the access opening 128 in the side wall of the RF power supply cabinet 102 to provide RF shielding against stray RF radiation escaping from the access opening 128.

Figure 5:
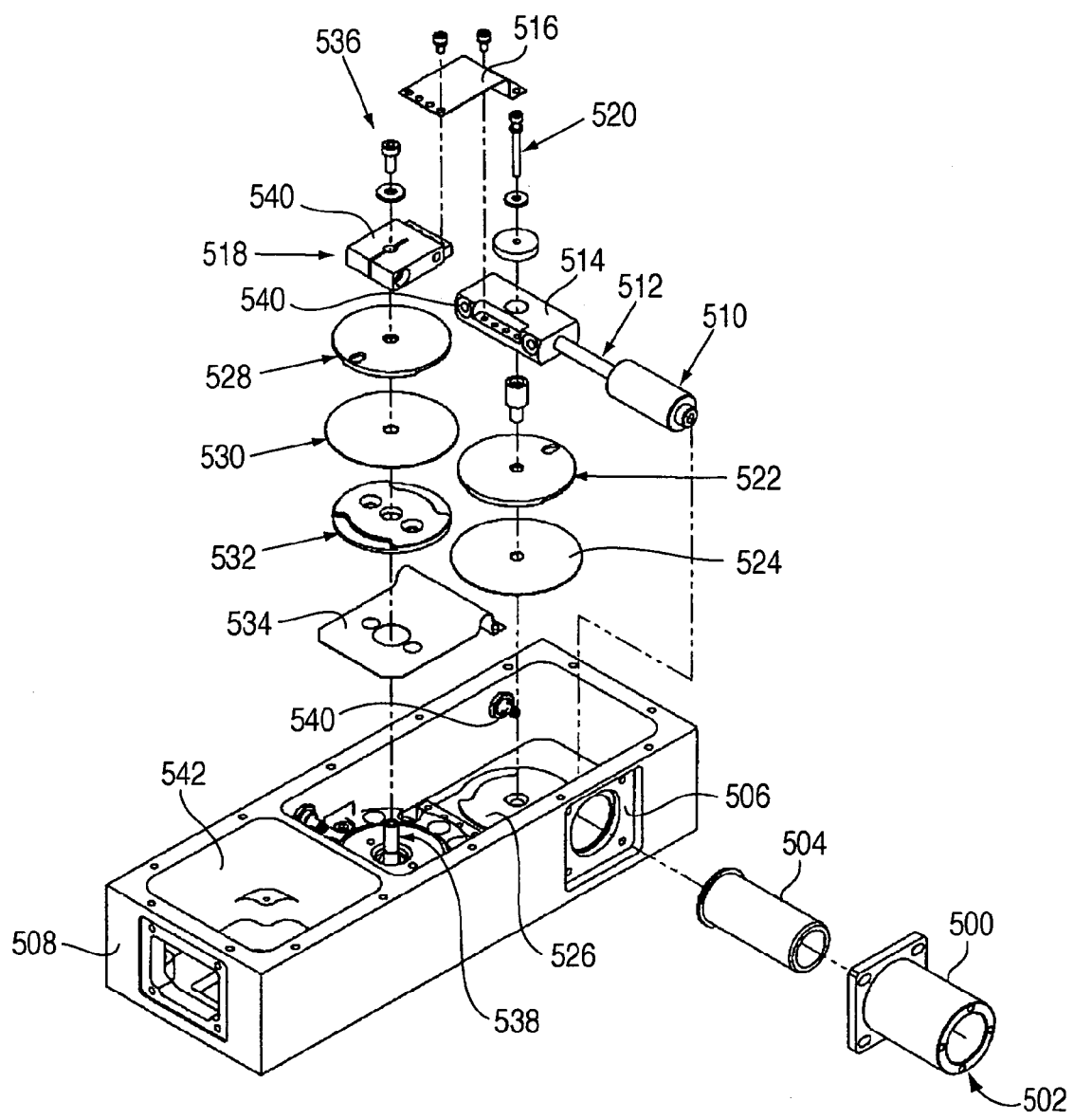
FIG. 5 is a perspective drawing illustrating a detailed exploded view of an embodiment of impedance matching network box shown in FIG. 1.

FIG. 5 illustrates, in an exploded view format, an embodiment of the RF shielded series inductor high power interconnector of FIG. 2, the two L shaped L-C impedance matching network elements ($L_1$, $C_1$, $L_2$ and $C_2$), and how these components fit into the impedance matching network box. Starting from its right bottom, FIG. 5 shows the RF interconnect housing 500 with four holes 502. These four holes 502 are used for mounting the power combiner ground ring 134 of FIG. 4. A ceramic RF interconnector 504 slides into housing 500 and housing 500 is then screwed into the machined recess 506 of the impedance matching box 508 (item 104 in FIG. 4). The co axial inner conductor 510 slides inside the insulator RF interconnector 504. The hole shown at the end of inner conductor 510 is where the screw 138 of FIG. 4 is screwed into. Note that to the left of the metal rod 512 forming the co-axial inner conductor 510, the diameter of the metal rod 512 of this one piece assembly is reduced. The length and diameter of this portion of the RF shielded, series inductor, high power interconnector assembly 116 determines the value of inductor $L_1$ of FIGS. 2 and 3. To increase the inductance of inductor $L_1$, the diameter of this portion 512 is reduced; one can also increase the inductance by increasing its length. To the left of the reduced diameter portion of metal rod 512 is the portion of the one-piece, RF shielded, series inductor high power interconnect assembly 116. This portion is enlarged to enable it to serve as the liquid cooling heat sink connector 514 that connects the common point of inductor $L_1$, inductor $L_2$ and capacitor $C_1$ of FIG. 3 where $Z_H$>$Z_P$. Connector 514 connects to an inductor strap 516. The width and length of inductor strap 516 determine the value of inductor $L_2$ of FIG. 3. The value of inductor $L_1$ determines the length and width of connector 514 and thus the value of inductor $L_2$ and also the value of capacitor $C_2$ of FIG. 3. If inductor $L_1$ is too small, then the reduction in the length and width of the inductor strap 516 becomes difficult to achieve in order to realize the small inductor $L_2$ determined by inductor $L_1$. The other end of the metal strap 516 is connected to the liquid cooled RF feed-through pin clamp 518. Mounting screw 520 with its lock washer, washer, ceramic insulator disc assembly compresses the water cooled heat sink connector 514 to the upper metal plate 522 forming the hot electrode of capacitor $C_1$, onto the ceramic disc 524 that forms the capacitor $C_1$, onto the metal ground plate 526 for capacitor $C_1$. The liquid cooled RF feed-through pin clamp 518 presses down on the hot metal electrode 528 of capacitor $C_2$, the Zirconium dielectric disc 530 of capacitor $C_2$ of, and the metal ground electrode 532 of capacitor $C_2$, onto the metal ground strap 534 connecting the RF ground between capacitor $C_1$ and capacitor $C_2$ of FIG. 3. The Zirconium dielectric disc 530 for capacitor $C_2$ is used because of its higher dielectric constant over the ceramic material used in capacitor $C_1$, thereby achieving the higher value of capacitance required by capacitor $C_2$ in a size that fits within the network box 104 of FIG. 2. The screw 536 connects the hot electrode of capacitor $C_2$ to the center conductor of the co-axial cable 538 of the RF connector for the hermetically sealed low inductor RF feed-through 120 of FIG. 2 and cable 538 to form the common connection point between capacitor $C_2$ and inductor $L_3$ of FIG. 3. The strap 534 is needed to minimize the length of the RF ground path between capacitor $C_1$ and capacitor $C_2$. Holes 540 for making liquid cooled connections for the various components are also shown in FIG. 5 configuration.

On the left side of the impedance matching network box 508 in FIG. 5 is a chamber 542 that is reserved for a discharge igniter housing which is not part of this invention and, therefore, is not discussed in detail herein.

Figure 6:
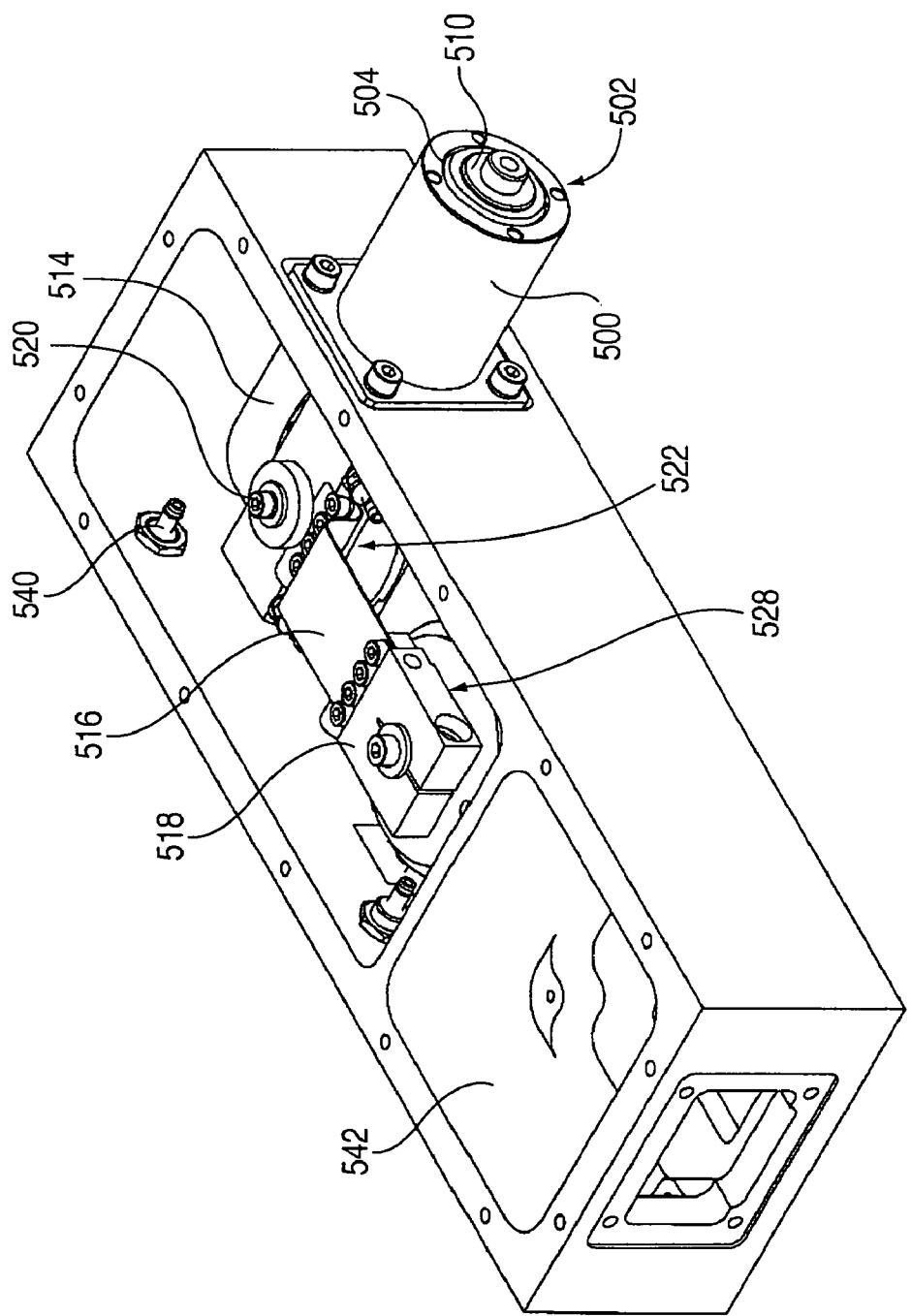
FIG. 6 is a perspective drawing illustrating an assembled view of the embodiment of the impedance matching network box shown in FIG. 5.

FIG. 6 shows the completed assembly of FIGS. 3 and 5.

FIG. 7 shows a cross-sectional view of the assembly taken through the section A-A indicated in FIG. 4. Note that the attachment of the liquid cooled RF shielded impedance matching network box 104 (FIG. 2) to the laser tube housing is shown. The protrusion of the RF shield series inductor high power interconnector into the RF power supply cabinet 102 is also shown. Corner openings 702 are shown where the compressed copper tubes carrying the liquid coolant for the laser tube housing 106 to be placed as shown in FIG. 6. Note the numerous shielded grooves openings 704 where well known RF shielding material is to be placed and compressed to prevent the leakage of RF radiation into the environment.

It has been found that when 100 MHz RF pulses having a power of approximately 20 kW, with a corresponding voltage of approximately 1.7 kV, are applied to the hermetically sealed, low inductive feed-through described above, a corona discharge occurs in the feed-through when it was connected to a sealed off $CO_2$ slab laser. The corona occurs around the edges of the metal-dielectric interfaces of the capacitor that forms part of the LC impedance matching network that is inserted between the RF power supply and the laser discharge impedance. The corona discharge consumes RF energy that normally would be delivered to the laser discharge generated between the electrodes of the slab laser. The corona, therefore, reduces the laser's efficiency.

An alternate embodiment of the feed-through, described in detail below, provides a solution to the corona problem by making a minor physical modification to the capacitor structure used in the RF feed-through/RF impedance matching network utilized in the above-described embodiment, which had an output power in the 400-500 watt range. The advantage of this alternate embodiment is that it enables essentially the same RF feed-through to be used to drive both lower power and higher power $CO_2$ slab lasers, while maintaining essentially the same low cost and small size of the lower power version.

Figure 8B:
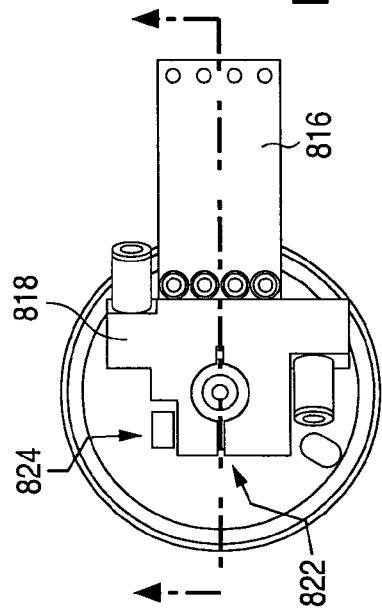
FIGS. 8A, 8B and 8C are exploded, top and partial cross-section views, respectively, illustrating a single capacitor configuration of components in an impedance matching network utilizable in the FIG. 1 laser system.
Figure 8C:
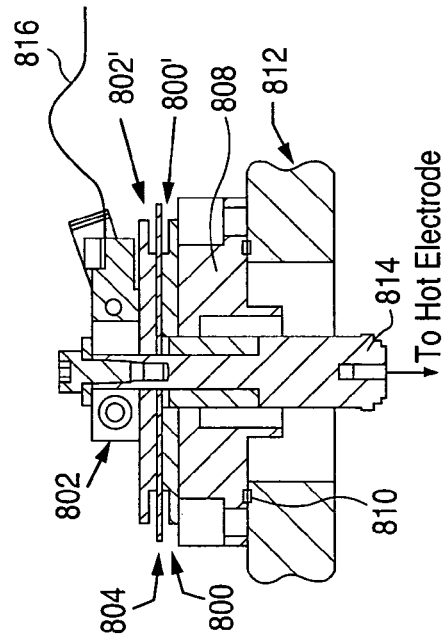
Figure 8A:
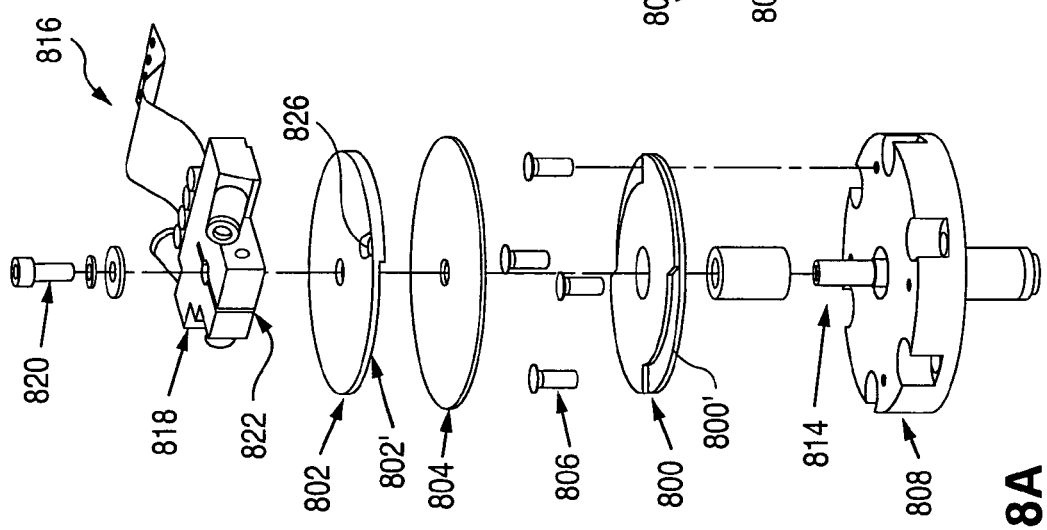

FIG. 8A shows a detailed exploded view of the "single capacitor" configuration, low inductance, hermetically sealed, feed-through described above (e.g., FIG. 5); FIG. 8B is a top view and FIG. 8C is an assembled cross-section view. Of particular interest in the "single capacitor" configuration are the two capacitor copper plates 800 and 802 and their respective machined recesses 800' and 802'. The thickness of the copper plates 800, 802 is typically ⅛ inches; the depth of the recesses 800', 802' is approximately one-half of this value. With a RF power of approximately 9.5 kW applied to the feed-through, no corona was generated within the recess openings 800' and 802', that is, the recesses that exist between the top and bottom surfaces of the dielectric disc 804 and the metal capacitor plates 802 and 800, respectively. The thickness of the dielectric disc 804 is approximately 0.020 inches. The value of the capacitance required to achieve an impedance match is approximately 174 pf. Capacitor plate 800 is bolted by the four screws 806 to the base of the RF feed-through 808 which is, in turn, bolted to the outside surface of the laser housing 812 (FIG. 8C). As discussed above, the feed-through of FIGS. 8A-8C is located within a shielded RF impedance matching network box that is mounted on the hermetically sealed $CO_2$ laser housing, as shown in FIG. 5. As shown in FIG. 8C, the hermetic seal of the laser housing, when the feed-through is connected to it, is maintained by a c-spring O-ring 810 that is located between the base 808 of the feed through and the laser housing surface 812. The value of the inductance of the RF lead 814 of the feed-through connected to the laser's hot electrode is ~18 nh for both the FIG. 8A-8C embodiment and for the low inductance alternate embodiment discussed below.

The recesses 800' and 802' in the capacitor copper plates 800 and 802, respectively, are present to provide a tuning capability of the capacitance by twisting the plates 800 and 802 with respect to each other. This capacitance variation adjusts the impedance match to the laser discharge in conjunction with the inductance provided by the RF low inductance strap 816 that supplies RF power to the feed through via the liquid cooled clamp assembly 818 and the inductance associated with the feed through lead 814. The inductance provided by the strap 816 is approximately 18 nh. This low strap inductance is the same for both the lower power embodiment and the alternate higher power handling feed-through of the alternate embodiment. The resistance of the laser discharge for the 400-500W $CO_2$ laser excited by the feed-through was approximately 3.6 Ohms.

When tightened, the clamp retaining screw 820 pushes down on the single capacitor configuration shown in FIGS. 8A-8C to obtain good contact between the metal plates 800 and 802, the dielectric plate 804, and the RF ground of the structure. Good RF contact is obtained to the hot RF connector post 814 for the input to the feed-through by tightening up on the slot 822 in the clamp assembly 818 by turning the bolt 824, best shown in FIG. 8B.

The capacitance is adjusted by hand turning capacitor plate 802 with respect to the stationary capacitor plate 800. The hand turning is facilitated by placing a dielectric tool into the opening 826 formed in plate 802 and using this tool as a handle to rotate the plate 802. The reflected RF power from the discharge is then monitored as the capacitance is varied by twisting plate 802. The reflected power is minimized by adjusting the capacitance. When the reflected power is at a minimum by this process, the laser is impedance matched.

As stated above, no corona appeared in the recesses when the FIG. 8A-8C feed-through was subjected to 8 to 9.5 kW of average RF power at a RF frequency of 100 MHz. However, when this feed-through was subjected to slightly twice this power level (i.e. ~0.20 kW with a corresponding voltage of ~1.7 kV), corona appeared in the recesses 800' and 802'.

Figure 9A:
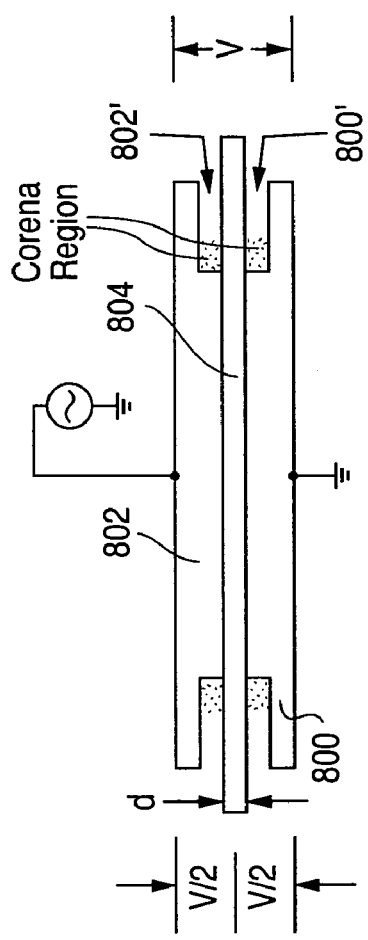
FIG. 9A is a partial cross-section drawing illustrating details of the single capacitor configuration shown in FIGS. 8A-8C.

FIG. 9A summarizes in sketch form the basic problem experienced by the FIGS. 8A-8C single capacitor configuration. That embodiment utilizes a thin dielectric disc 804 of some small thickness "d" that is inserted between two metal discs 800 and 802 with recesses above (802') and below (800') the dielectric disc 804. It is assumed that the capacitance $C_0$ of the structure of FIG. 9A has been fixed and that a voltage "V" is applied across this capacitor. The area of the metal discs 800, 802 sandwiching the dielectric disc 804 is assumed to be "A". The capacitance $C_0$ of the structure is approximately given by the well-known relationship:

$$C_0 = \frac{\epsilon_d A}{36\pi d(10^5)} \text{ microfarads} \quad (1)$$

Where: $\epsilon_d$ is the dielectric constant of the dielectric,

A is the metal plate area in square centimeters, and d is the thickness of the dielectric in centimeters whose value is assumed to be much smaller than "A".

Equation (1) can be reduced to:

$$C_0 = \frac{kA}{d} \text{ where } k = \frac{\epsilon_d}{36\pi(10^5)} \quad (2)$$

As shown in FIG. 9A, one half of voltage "V" appears across each of the top (802') and bottom (800') recesses at the edges where the metal plates 802 and 800, respectively, come in contact with the dielectric disc 804. If the voltage (V) becomes equal to or greater than the corona generating voltage, corona will appear at the location of the recesses as shown in FIG. 9A. Once started, the corona steals power from the laser discharge and also spoils the impedance match between the laser discharge and the RF power supply. Both of these occurrences result in a poor performing $CO_2$ laser.

Figure 9B:
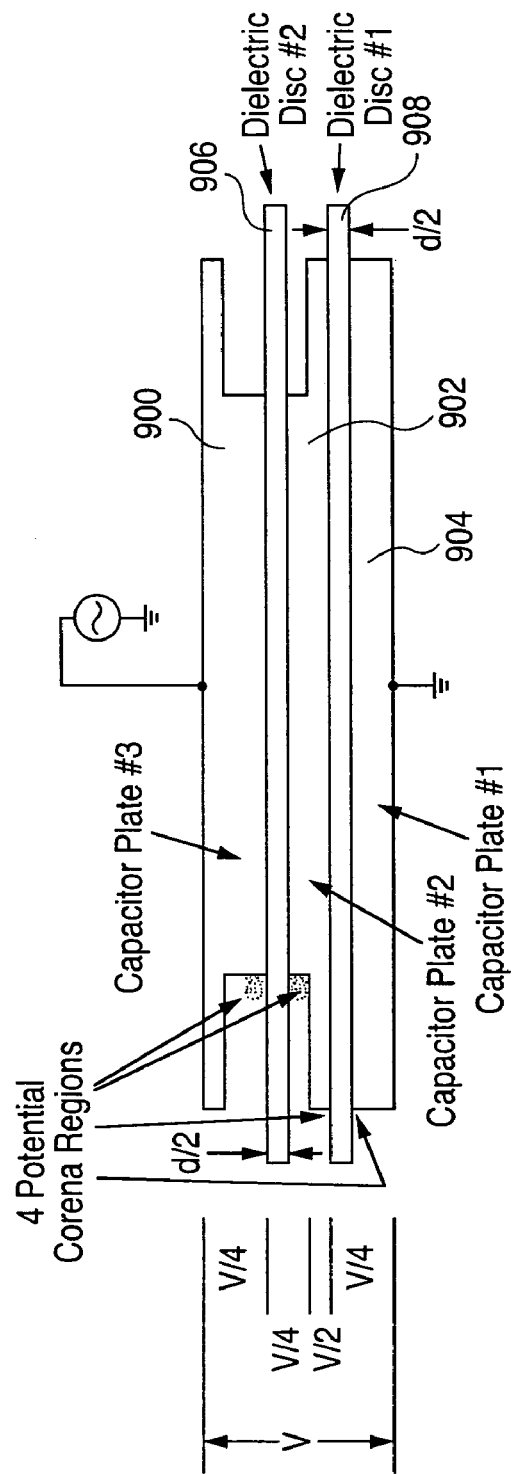
FIG. 9B is a partial cross-section drawing illustrating details of a twin capacitor configuration that can replace the single capacitor configuration shown in FIG. 9A.

The solution offered by the alternative embodiment of the invention is summarized by the "twin capacitor" configuration shown in FIG. 9B, again in schematic form. In essence, as shown in FIG. 9B, the capacitor Co of the single capacitor configuration is converted to two capacitors in series. Each capacitor has a value of twice Co. One example of how to double this capacitance value is by decreasing the dielectric thickness "d" by ½ while keeping the area "A" constant. (See Eq. 2). Consequently, the capacitance reactance $X_o$ is maintained constant for both the configurations of FIGS. 9A and 9B (See Eq. 3 to below). The impedance matching conditions between the RF power supply are achieved in this case by varying the capacitance $C_0$ from 174 pf for the FIG. 9A configuration to 190 pf for the FIG. 9B configuration. This range of values can be easily accommodated by the capacitance variations provided by the recesses in the metal discs. The higher capacitance for the higher power feed-through is required to impedance match the lower discharge resistance (~1.9 Ohms) of the higher power laser.

From FIG. 9B, it can be appreciated that each of the capacitors will experience one half of the voltage, but since there are four locations where the edges of the three metal capacitor plates 900, 902, 904 interface with the two dielectric plates 906, 908, each of these four metal/dielectric interfaces will, therefore, experience only ¼ of the applied voltage "V". Having two dielectric discs 906, 908, each having ½ the thickness of the original single dielectric disc (disc 804 in FIG. 9A), along with an additional metal disc 904 without a machined recess, causes minimal mechanical changes between the lower power and the higher power feed-through along with minimum increase in size and cost.

For the example discussed above, the voltage reduction of "V/4" was sufficient to address the corona problem. If higher voltages are to be experienced by the feed-through, then those skilled in the art will appreciate that this process can be expanded to more than two series capacitors in order to further reduce the voltages at the metal plate-dielectric interfaces of the capacitors. As the number of capacitors increases, a point is reached at which the thickness of the dielectric plates becomes too thin to be practical. At this point, the area of the metal/dielectric discs can be adjusted in order to realize more capacitors.

The reactance "X" of each of the two capacitors are made equal in the example of FIG. 9B so that the total reactance $X_o$ of the FIG. 9B configuration is:

$$X_o = 2X = 2\left(\frac{1}{j\omega 2C_o}\right) = \frac{1}{j\omega C_o} \quad (3)$$

where $\omega$ is the angular RF frequency=$2\pi f$, where "f" is the RF frequency. Consequently, the reactances of the FIG. 9A and FIG. 9B configurations are maintained equal.

An implementation of FIG. 9B twin capacitor configuration is shown in an exploded view in FIG. 10A, a top-down view in FIG. 10B, and a cross-sectional assembly view (taken along line B-B in FIG. 10B) in FIG. 10C. The thickness of each of the two dielectric discs 1000 and 1002 in FIG. 10A are ½ the thickness of the single dielectric disc in FIG. 9A. In the new two-capacitor in series configuration shown in FIG. 10A, there are three metal capacitor plates 1004, 1006 and 1008, with only capacitor plates 1006 and 1008 having recesses 1006' and 1008', respectively, to allow tuning the capacitors, as discussed above, to achieve minimum back reflection from the laser discharge. The extra metal plate 1004 adds ~⅛ of an inch to the height of the feed-through. It should be understood that, if a larger range of variation of capacitance is desired, a recess can also be placed in the third capacitor plate 1004. Obtaining a minimum RF back reflection condition as the capacitance is varied again indicates that an impedance match condition has been achieved.

In summary, the alternate embodiment of FIGS. 10A-10C provides a means of avoiding a corona discharge in a low inductance hermetical sealed RF feed-through having essentially the same configuration, size, and cost as a feed-through that is capable of handling less than one half the RF power and corresponding voltage. Except for the modification of having multiple capacitors in series, the new feed-through is essentially the same as the FIG. 5 feed through that provided 8 kW to 9.5 kW (~0.75 kV) of 100 MHz RF power to a 400-500 W output $CO_2$ slab laser.

It should be understood that the particular embodiments of the invention described above have been provided by way of example and that other modifications may occur to those skilled in the art without departing from the scope and spirit of the invention as expressed in the appended claims and their equivalents.

What is claimed is:

1. An impedance matching interconnector for connecting the power output of an RF power supply to a laser tube housing of a slab laser system, the impedance matching interconnector comprising;
    a co-axial conductor having an inner conductor connected to receive the power output of the RF power supply and a grounded outer conductor, the co-axial conductor having an impedance characteristic to match the output impedance of the RF power supply output;
    a first L shaped network that includes a first inductor having a first end connected to the inner conductor of the co-axial conductor and a first capacitor structure having a first plate connected to a second end of the first inductor and a second plate connected to ground; and
    a second L shaped network that includes a second inductor having a first end connected to the common connection between the second end of the first inductor and the first plate of the first capacitor structure and a second capacitor structure having a first plate connected to a second end of the second inductor and a second plate connected to ground, the common connection between the second end of the second inductor and the first plate of the second capacitor structure being connected to the laser tube housing of the slab laser system.

2. The impedance matching interconnector of claim 1, and wherein the first and second plates of the second capacitor structure have a dielectric disc disposed therebetween, the dielectric disc having a top side and a bottom side, the first plate having a first recess formed in a bottom side thereof, the second capacitor plate having a second recess formed in a top side thereof.

3. The impedance matching interconnector of claim 2, and wherein the first plate is rotatable with respect to the second plate.

4. In a $CO_2$ slab laser system that includes an RF power supply box that provides an RF power supply output, an impedance matching network box that contains an impedance matching network for matching the output impedance of the RF power supply output to the input impedance of the laser discharge of the $CO_2$ slab laser system, and a hermetically sealed $CO_2$ laser tube housing box that contains the laser tube housing that contains the gas mixture, electrodes and optical resonator of the $CO_2$ slab laser system, the impedance matching network comprising:
    a co-axial conductor that extends through a grounded sidewall of the RF power supply box and an adjacent grounded sidewall of the impedance matching network box, the co-axial conductor having an inner conductor that extends into the RF power supply box and having a first end adapted to receive the RF power supply output and a second end that extends into the impedance matching network box, the co-axial conductor having an outer conductor that is electrically insulated from the inner conductor and connected to a grounded sidewall of the impedance matching network box, the inner conductor comprising a first inductor;
    a first capacitor structure that includes a first conductive capacitor plate electrically coupled to a grounded sidewall of the impedance matching network box, a second conductive capacitor plate electrically connected to the inner conductor of the co-axial conductor, and a first dielectric disc disposed between the first and second capacitor plates of the first capacitor structure;
    a second inductor connected between the first inductor and a second capacitor structure and electrically connected to a conductive feed-through structure that extends from the impedance matching network box into the laser tube housing box;
    a second capacitor structure that includes a first conductive capacitor plate electrically connected to the second inductor, a second conductive capacitor plate electrically coupled to a grounded sidewall of the impedance matching network box, and a second dielectric disc disposed between the first and second capacitor plates of the second capacitor structure.

5. The impedance matching network of claim 4, and wherein the first capacitor plate of the second capacitor structure has a first recess formed in a bottom side thereof adjacent to a top side of the second dielectric disc, and wherein the second capacitor plate of the second capacitor structure has a second recess formed in a top side thereof adjacent to a bottom side of the second dielectric disc.

6. The impedance matching network of claim 5, and wherein the first capacitor plate is rotatable with respect to the second capacitor plate.

7. The impedance matching network of claim 4, and wherein the inner conductor of the co-axial conductor comprises:
  a first cylindrical portion that extends at least partially into the RF power supply box and having a first end adapted to receive the RF power supply output, the first portion having a first diameter;
  a second cylindrical intermediate portion connected to a second end of the first portion, the intermediate portion having a diameter that is less than the first diameter; and
  a third portion connected to the intermediate portion and adapted to provide a common electrical connection among the first inductor, the second inductor and the first capacitor.

8. The impedance matching network of claim 7, and wherein the first end of the first cylindrical portion of the inner conductor is surrounded by a ceramic RF interconnector.

9. The impedance matching network of claim 7, and wherein the third portion of the inner conductor is water cooled.

10. The impedance matching network of claim 4, and wherein the second dielectric disc comprises Zirconium.

11. The impedance matching network of claim 10, and wherein the first dielectric disc comprises ceramic.

12. In a $CO_2$ slab laser system that includes an RF power supply box provides an RF power supply output, an impedance matching network box that contains an impedance matching network for matching the output impedance of the RF power supply output to the input impedance of the laser discharge of the $CO_2$ slab laser system, and a hermetically sealed $CO_2$ laser tube housing box that contains the laser tube housing that contains the gas mixture, electrodes and optical resonator of the $CO_2$ slab laser system, the impedance matching network comprising:
  a co-axial conductor that extends through a grounded sidewall of the RF power supply box and an adjacent grounded sidewall of the impedance matching network box, the co-axial conductor having an inner conductor that extends into the RF power supply box and having a first end adapted to receive the RF power supply output and a second end that extends into the impedance matching network box, the co-axial conductor having an outer conductor that is electrically insulated from the inner conductor and connected to a ground sidewall of the impedance matching network box, the inner conductor comprising a first inductor;
  a first capacitor structure that includes a first conductive capacitor plate electrically coupled to a grounded sidewall of the impedance matching network box, a second conductive capacitor plate electrically connected to the inner conductor of the co-axial conductor, and a dielectric disc disposed between the first and second capacitor plates of the first capacitor structure;
  a second inductor connected between the first inductor and a second capacitor structure and electrically connected to a conductive feed-through structure that extends from the impedance matching network box into the laser tube housing box;
  a second capacitor structure that includes first and second conductive capacitor plates electrically connected to the second inductor, a third conductive capacitor plate electrically coupled to a grounded sidewall of the impedance matching network box, a first dielectric disc disposed between the first and second capacitor plates of the second capacitor structure, and a second dielectric disc disposed between the second and third capacitor plates of the second capacitor structure.

13. The impedance matching network of claim 12, and wherein the first capacitor plate of the second capacitor structure has a first recess formed in a bottom side thereof adjacent to a top side of the second dielectric disc, and wherein the second capacitor plate has a second recess formed in a top side thereof adjacent to a bottom side of the second dielectric disc.

14. The impedance matching network of claim 13, and wherein the first capacitor plate of the second capacitor structure is rotatable with respect to the second capacitor plate of the second capacitor structure.

* * * * *